(12) United States Patent
Ishida et al.

(10) Patent No.: US 7,284,917 B2
(45) Date of Patent: Oct. 23, 2007

(54) COATING AND DEVELOPING SYSTEM AND COATING AND DEVELOPING METHOD

(75) Inventors: Seiki Ishida, Koshi-Machi (JP); Masahiro Nakaharada, Koshi-Machi (JP); Taro Yamamoto, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 73 days.

(21) Appl. No.: 11/346,430

(22) Filed: Feb. 3, 2006

(65) Prior Publication Data

US 2006/0177586 A1  Aug. 10, 2006

(30) Foreign Application Priority Data

Feb. 8, 2005  (JP) .............................. 2005-032204

(51) Int. Cl.
*G03D 5/00* (2006.01)
*G03B 27/32* (2006.01)
*G03B 27/52* (2006.01)

(52) U.S. Cl. .......................... 396/611; 355/27; 355/30; 134/902

(58) Field of Classification Search ................ 396/611; 355/27, 30, 53, 72; 134/902
See application file for complete search history.

(56) References Cited

U.S. PATENT DOCUMENTS 6,147,329 A * 11/2000 Okamura et al. ............ 219/390

6,814,809 B2 * 11/2004 Matsushita et al. ......... 118/666

FOREIGN PATENT DOCUMENTS

JP  2004-193597  7/2004

* cited by examiner

*Primary Examiner*—Alan Mathews
(74) *Attorney, Agent, or Firm*—Oblon, Spivak, McClelland, Maier & Neustadt, P.C.

(57) ABSTRACT

A coating and developing system is capable of preventing the contamination of a substrate with particles while the same coats a surface of a substrate with a resist film and develops the resist film after the substrate has been processed by immersion exposure. The coating and developing system includes: a processing block including coating units for forming a resist film on a surface of a substrate and developing units for processing the resist film formed on the substrate with a developer, and an interface block connected to the processing block and an exposure system for carrying out an immersion exposure process. The interface block includes: substrate cleaning units for cleaning the substrate processed by the immersion exposure process, a first carrying mechanism and a second carrying mechanism. The first carrying mechanism carries a substrate processed by immersion exposure to the substrate cleaning unit. The second carrying mechanism carries the substrate cleaned by the substrate cleaning unit. Thus the contamination of the substrate with external particles can be prevented and hence the spread of contamination with particles over the processing units of the processing block and substrates processed by the processing units can be prevented.

21 Claims, 9 Drawing Sheets

FIG. I

COATING AND DEVELOPING SYSTEM AND COATING AND DEVELOPING METHOD

BACKGROUND OF THE INVENTION

1. Field of the Invention

The present invention relates to a coating and developing system including a coating unit for coating a surface of a semiconductor wafer (hereinafter, referred to simply as "wafers") with a resist film and a developing unit for developing the resist film processed by immersion exposure by using a developer, and a coating and developing method.

2. Description of the Related Art

A photoresist pattern forming process, namely, one of semiconductor device fabricating processes, includes the steps of forming a resist film on a surface of a wafer by applying a resist to the surface of the wafer, exposing the resist film in a predetermined pattern, and developing the exposed resist film by using a developer to form a resist pattern. Generally, this photoresist pattern forming process is carried out by a system built by connecting an exposure system to a coating and developing system including a coating unit and a developing unit.

A wafer is transferred, for example, through an interface block interposed between the coating and developing system and the exposure system from the coating and developing system to the exposure system and from the exposure system to the coating and developing system. An interface block provided with two carrying arms is mentioned in Patent document 1. The two carrying arms cooperate to transfer a wafer between the coating and developing system and the exposure system.

An immersion exposure method has been studied in recent years to improve exposure resolution to cope with the progressive fining of device patterns and the progressive thickness reduction of films. The immersion exposure method coats a resist film formed on a surface of a wafer with a transparent liquid layer, such as a layer of ultrapure water, and exposes the resist film formed on surface of the wafer through the liquid layer to light emitted by a light source to form a predetermined latent circuit pattern in the resist film. Immersion exposure utilizes the characteristic of light that the wavelength of light shortens in water. For example, the wavelength of ArF light shortens from 193 nm in air to about 134 nm in water.

When a liquid layer is formed on the surface of a resist film for immersion exposure, the resist is likely to be eluted by the liquid layer during the photoresist pattern forming process. An eluate containing the resist eluted by the liquid layer is likely to adsorb particles. The liquid forming the liquid layer remain on the wafer W after the exposure process. If the eluates containing the resist remain on the wafer W, particles may be produced on the surface of the wafer. When the wafer contaminated with particles is transferred from the exposure system to the carrying arm of the interface block, the carrying arm will be contaminated with the particles. Then, other wafers carried by the contaminated carrying arm will be contaminated with the particles.

When a wafer contaminated with particles in the exposure process or a wafer carried by the carrying arm contaminated with particles is carried to the coating and developing system, the particles sticking to the wafer stick to, for example, the carrying arm of the coating and developing system. The carrying arm contaminated with particles scatters the particles in a processing unit and contaminates other wafers with particles. Consequently, it is likely that the coating and developing system is contaminated entirely with particles. When a wafer contaminated with particles is subjected to heating process, parts contaminated with particles of the wafer and those not contaminated with particles are heated at different temperatures, respectively. Particularly, in a heating process for diffusing an acid catalyst produced during exposure in a resist film of a chemically amplified resist, particles adhering to the resist film affect the line-width of the resist pattern greatly. Moreover, particles adhering to the wafer are likely to damage the resist pattern during the developing process.

If contamination with particles (hereinafter, referred to as "particle contamination") spreads in the coating and developing system and a heating unit is used for processing a wafer both before and after the exposure process, a wafer to be transferred through the heating unit to the exposure system will be contaminated. Particles are transferred from the carrying arm to a wafer being carried to the exposure system as well as to a wafer being carried out of the exposure system. Therefore, particles may be accumulated in the exposure system. When the exposure system carries out an immersion exposure process, particles migrating in a liquid layer in an exposed area obstruct normal exposure. Consequently, an accurate resist pattern cannot be formed and defects in the resist pattern are likely to be distributed on the wafer.

Formation of water marks is another problem other than that of particle contamination in immersion exposure. Water marks form when a liquid used for immersion exposure and remaining on a wafer is dried due to the solidification of solids dissolved in the liquid. Water marks will obstruct the normal processing of a wafer by an exposure process. Any measures to deal with those problems are not mentioned in Patent document 1. Patent document 1: JP-A No. 2004-193597

SUMMARY OF THE INVENTION

The present invention has been made to solve those problems and it is therefore an object of the present invention to provide a coating developing system and a coating and developing method capable of restraining particle contamination when a resist film is formed on a substrate by applying a resist to the substrate and the resist film processed by immersion exposure is developed. Another object of the present invention is to provide a coating and developing system and a coating and developing method capable of preventing processing a substrate by an abnormal developing process due to water marks formed on the substrate when a liquid used for immersion exposure dries.

A coating and developing system according to the present includes: a processing block including coating units for forming a resist film on a surface of a substrate and developing units for processing the substrate with a developer after the substrate has been processed by an exposure process; an interface block connected to the processing block and an exposure system for carrying out an immersion exposure process in which a liquid layer is formed on the substrate; wherein the interface block includes: a substrate cleaning units for cleaning the substrate processed by the immersion exposure process, a first carrying mechanism provided with a holding member for carrying the substrate from the exposure system to the substrate cleaning unit, and a second carrying mechanism for carrying the substrate from the substrate cleaning unit to the processing block.

In the coating and developing system according to the present invention, the second carrying mechanism may transfer a substrate from the processing block to the first carrying mechanism and the first carrying mechanism may transfer the substrate to the exposure system, or the first carrying mechanism may be provided with a first holding member specially for carrying a substrate from the exposure system to the substrate cleaning unit and a second holding member specially for carrying a substrate to the exposure system. The second carrying mechanism may be provided with a carrying arm for carrying a substrate out of the substrate cleaning unit and a transfer arm for receiving a substrate from the carrying arm and transferring the same to the processing block.

The interface block may be provided with a holding member cleaning unit, for cleaning the holding member, of the first carrying mechanism, for carrying a substrate to the substrate cleaning unit. The holding member cleaning unit may be combined with the substrate cleaning unit. For example, the holding member cleaning unit is disposed opposite to a carrying path along which the carrying arm advances into the substrate cleaning unit.

The coating and developing system according to the present invention includes, for example, a humidifying unit for humidifying an atmosphere around a substrate being carried to the substrate cleaning unit to restrain the drying of the substrate processed by immersion exposure, and the humidifying unit may be combined, for example, with the first carrying mechanism.

A coating and developing method according to the present invention of coating a surface of a substrate with a resist film, processing the resist film by immersion exposure using a liquid layer formed on the resist film formed on the substrate, carrying the substrate to a processing block and developing the exposed resist film by a developer includes the steps of: carrying the substrate processed by immersion exposure to a substrate cleaning unit by a first carrying mechanism; cleaning the substrate by a substrate cleaning unit; and carrying the substrate cleaned by the substrate cleaning unit to the processing block by a second carrying mechanism.

The step of carrying the substrate to the substrate cleaning unit in the coating and developing method may carry the substrate by a first special holding member included in the first carrying mechanism, and may include the step of carrying the substrate from the exposure system to the substrate cleaning unit by a second special holding member included in the first carrying mechanism.

The coating and developing method may include the step of cleaning the first special holding member, for carrying the substrate to the substrate cleaning unit, included in the first carrying mechanism by a holding member cleaning unit. When the first special holding member is cleaned by the holding member cleaning unit, the holding member cleaning unit is disposed, for example, opposite to a carrying path along which a carrying arm advances into the substrate cleaning unit. The coating and developing method may include the step of humidifying an atmosphere around the substrate in a period in which the substrate transferred from the exposure system to the interface block is carried to the substrate cleaning unit. The humidifying step for humidifying an atmosphere around the substrate is carried out by the humidifying unit included in, for example, the first carrying mechanism.

According to the present invention, the first carrying mechanism carries the substrate processed by immersion exposure by the exposure system to the substrate cleaning unit, and then the substrate cleaning unit cleans the substrate. Therefore, even if the substrate contaminated with particles of the resist dissolved in the liquid layer in the immersion exposure, the particles can be removed from the substrate. Since the cleaned substrate is carried by the second carrying mechanism instead of by the first carrying mechanism, the contamination of the processing units of the processing block and the substrate processed by the processing units with particles can be avoided. Consequently, adverse influences of particles on the line-width of a pattern during a heating process, damaging the pattern with particles in the developing process and obstruction of exposure by the migration of particles in the liquid layer during immersion exposure can be prevented. Thus an accurate resist pattern can be formed on a substrate.

Since the humidifying unit controls the humidity of an atmosphere through which the substrate processed by immersion exposure is carried to the substrate cleaning unit, formation of water marks due to the drying of the liquid remaining on the substrate processed by immersion exposure and being carried to the substrate cleaning unit can be prevented. Consequently, obstruction of the developing process by water marks can be restrained and an accurate resist pattern can be formed on the substrate.

DESCRIPTION OF THE PREFERRED EMBODIMENTS

Figure 1:
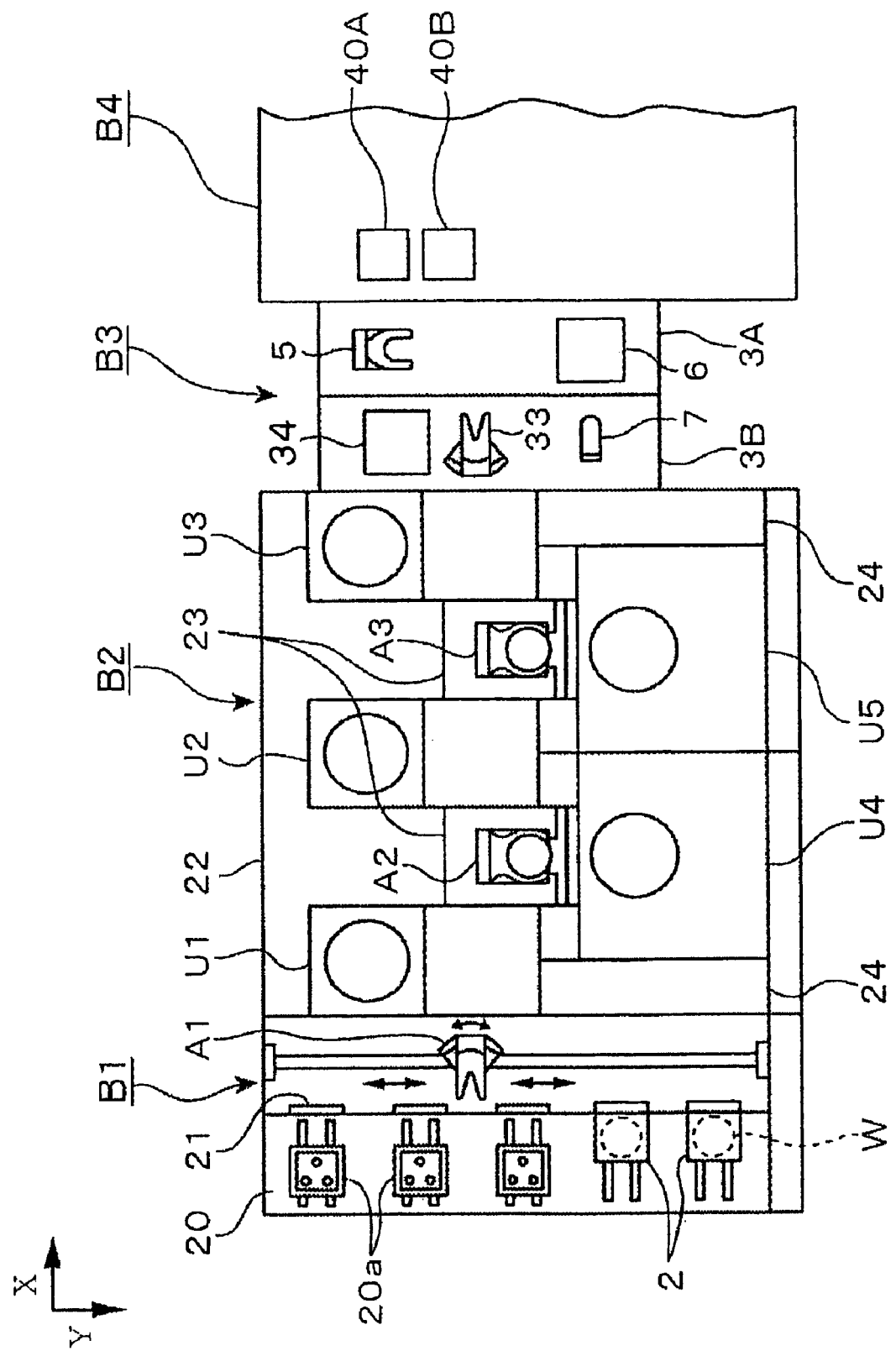
FIG. 1 is a plan view of a coating and developing system in a first embodiment according to the present invention.
Figure 2:
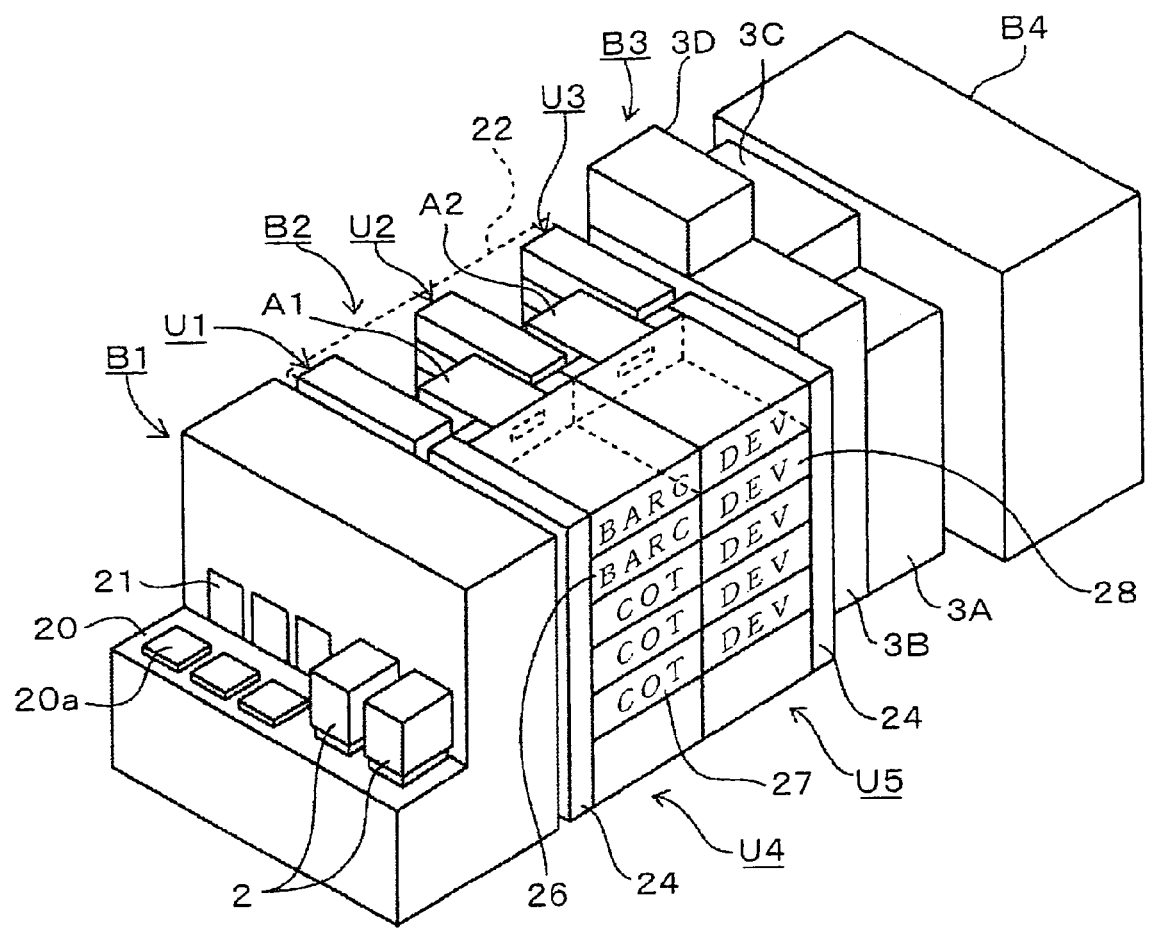
FIG. 2 is a perspective view of the coating and developing system shown in FIG. 1.

The constitution of a coating and developing system in a first embodiment according to the present invention will be described with reference to FIGS. 1 and 2. FIG. 1 is a plan view of a resist pattern forming apparatus built by connecting the coating and developing system in the first embodiment to the exposure system that carries out immersion exposure, and FIG. 2 is a perspective view of the resist pattern forming apparatus shown in FIG. 1. A carrier 2 containing, for example, thirteen wafers W is delivered to a carrier handling block B1. The carrier handling block B1 has a carrier station 20 provided with carrier support tables 20*a* capable of supporting a plurality of carriers 2 thereon, respectively, gates 12 formed in a wall behind the carrier support table 20*a*, and a transfer device A1 capable of extending through the gate 21 to the carrier 2 to take out the wafer W from the carrier 2.

A processing block B2 surrounded by a casing 22 is connected to the back end of the carrier handling block B1. The processing block B2 includes three shelf units U1, U2 and U3 each formed by stacking up heating and cooling systems in layers, liquid-processing units U4 and U5, and main carrying devices A2 and A3 for carrying a wafer W from and to the component units of liquid-processing units U4 and U5. The shelf units U1, U2 and U3 and the main carrying devices A2 and A3 are arranged alternately in a row. Wafer transfer openings, not shown, are formed in the joints of the adjacent units. A wafer W can be freely moved from the shelf unit U1 through the shelf unit U2 to the shelf unit U3 in the processing block B2. As viewed from the side of the carrier handling block B1, the shelf units U1, U2 and U3 are arranged in a left part of the processing block B2 and the liquid-processing units U4 and U5 are disposed in a right part of the processing block B2. The main carrying device A2 is placed in a space 23 defined by the opposite side surfaces of the shelf units U1 and U2, the inner side surface of the liquid-processing unit U4 and a back wall. The main carrying device A3 is placed in a space 23 defined by the opposite side surfaces of the shelf units U2 and U3, the inner side surface of the liquid-processing unit U5 and a back wall. A temperature and humidity control unit 24 includes temperature controllers for controlling the temperature of processing liquids used by the units, and ducts for air conditioning.

Each of the shelf units U1, U2 and U3 is built by stacking up, for example, ten processing units that process a wafer by pretreatment processes before the wafer is processed by the liquid-processing units U4 and U5 and by posttreatment processes after the wafer has been processed by the liquid-processing units U4 and U5, respectively. The processing units included in each of the shelf units U1, U2 and U3 are baking units PAB, not shown, for heating (baking) a wafer W and cooling units for cooling a wafer w. As shown in FIG. 2, the liquid-processing unit U4 is built by stacking up resist application units COT 27 and antireflection film forming units BARC 26 on a chemical solution container containing a chemical solution, such as a resist or a developer, and the liquid-processing unit U5 is built by stacking up, for example, five developing units DEV 28 for processing a wafer W by a developing process using a developer on a chemical solution container containing a chemical solution, such as a developer.

An interface block B3 is disposed behind the shelf-unit U3 of the processing block B2, and a developing system B4 is connected to the interface block B3. The developing system B4 is provided with a receiving stage 40A for receiving a wafer W from the interface block B3, and a delivery stage 40B for delivering a wafer W to the interface block B3.

The interface block B3, which is an essential part of the present invention, will be specifically described with reference to FIGS. 1 and 3. The interface block B3 includes transfer chambers 3A and 3B longitudinally arranged between the processing block B2 and the exposure system B4, an air conditioning unit 3C for controlling temperature and humidity placed on the transfer chamber 3A, and an air current control unit 3D placed on the transfer chamber 3B. The transfer chamber 3A is a closed space defined by a casing. Openings, not shown, are formed in the side panels of the casing, and the openings are closed respectively by shutters. A carrying arm 5, namely, a first carrying mechanism, is disposed in the transfer chamber 3A. The carrying arm 5 carries a wafer W from and to the stages 40A and 40B. For example, two cleaning units 6 are stacked in two layers in the transfer chamber 3A. The air conditioning unit 3C supplies a gas, such as humidified air of a predetermined temperature, in a down flow into, for example, the transfer chamber 3A for controlling the temperature and humidity of the transfer chamber 3A. The humidified air is supplied into the transfer chamber 3A to prevent a wafer W transferred from the exposure system B4 to the transfer chamber 3A from drying.

Figure 4:
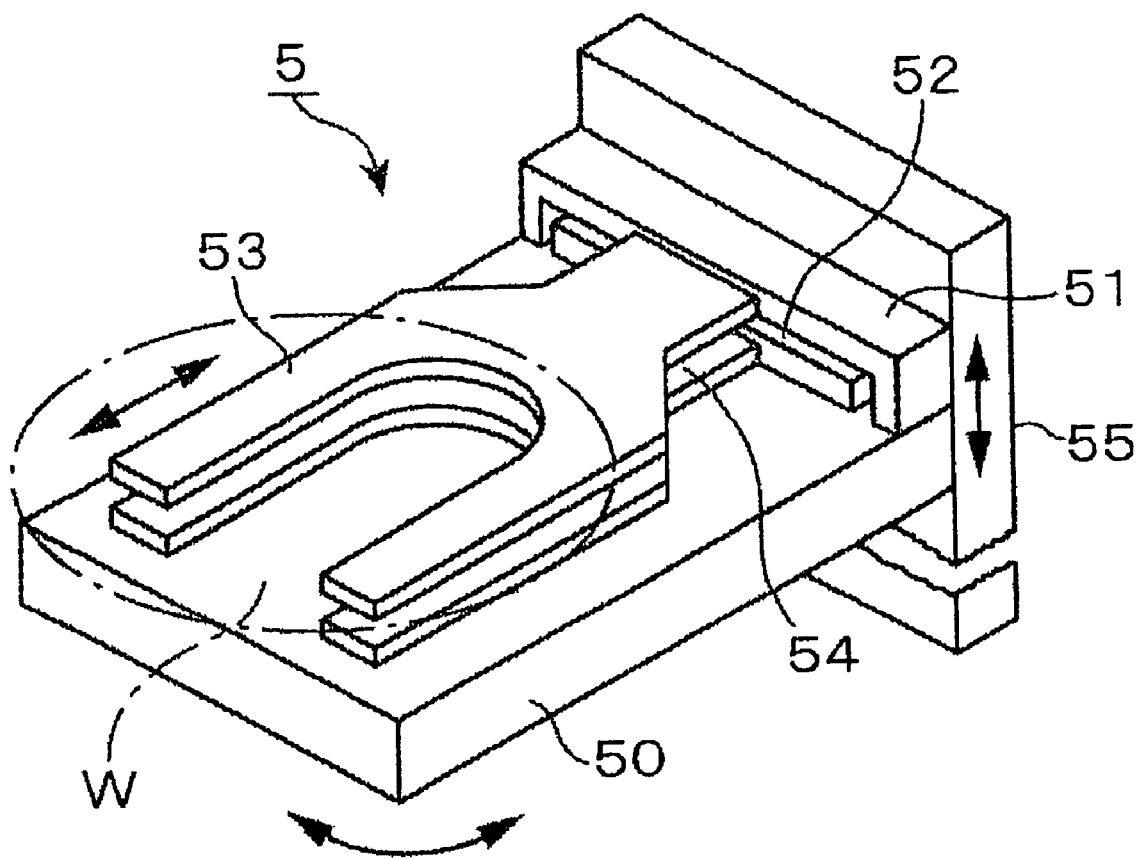
FIG. 4 is a perspective view of a carrying mechanism included in the interface block.

The carrying arm 5 will be described with reference to FIG. 4. The carrying arm 5 has a base member 50 capable of vertically moving along a guide rail 55. The guide rail 55 is capable of turning about a vertical axis and of moving in horizontal directions. Two arm members (holding members), namely, an upper arm member 53 and a lower arm member 54, are mounted on the base member 50. The arm members 53 and 54 are, for example, bifurcate plates. The arm members 53 and 54 are held by moving members 51 and 52, respectively, and are individually movable in horizontal directions.

In this specification, a member, of a carrying mechanism for carrying a substrate, to be brought into contact with a substrate to hold the substrate thereon is called an arm member, a member holding the arm member and capable of moving is called a moving member, and a combination of the arm member and the moving member is called a carrying arm.

Figure 5:
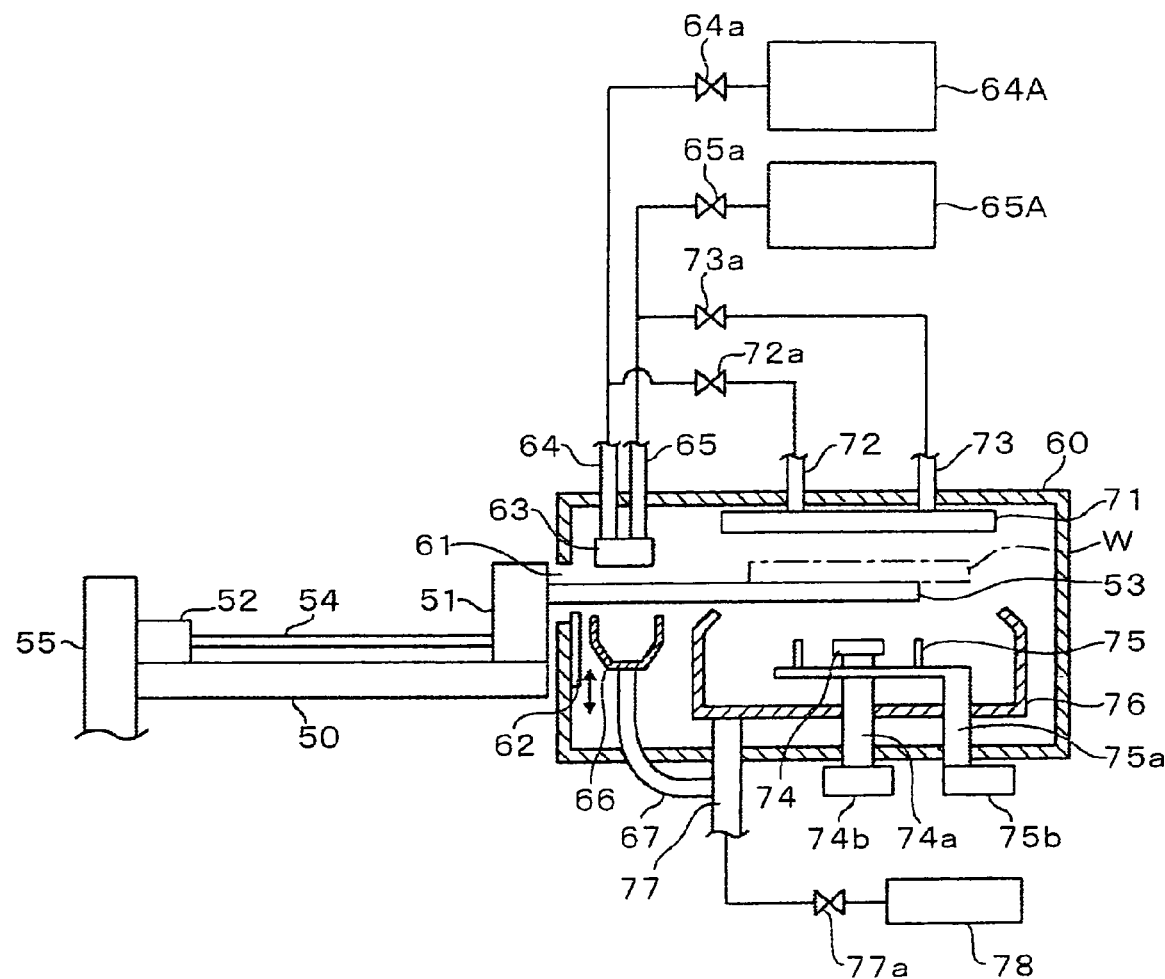
FIG. 5 is a longitudinal sectional view of a cleaning unit included in the interface block.
Figure 6:
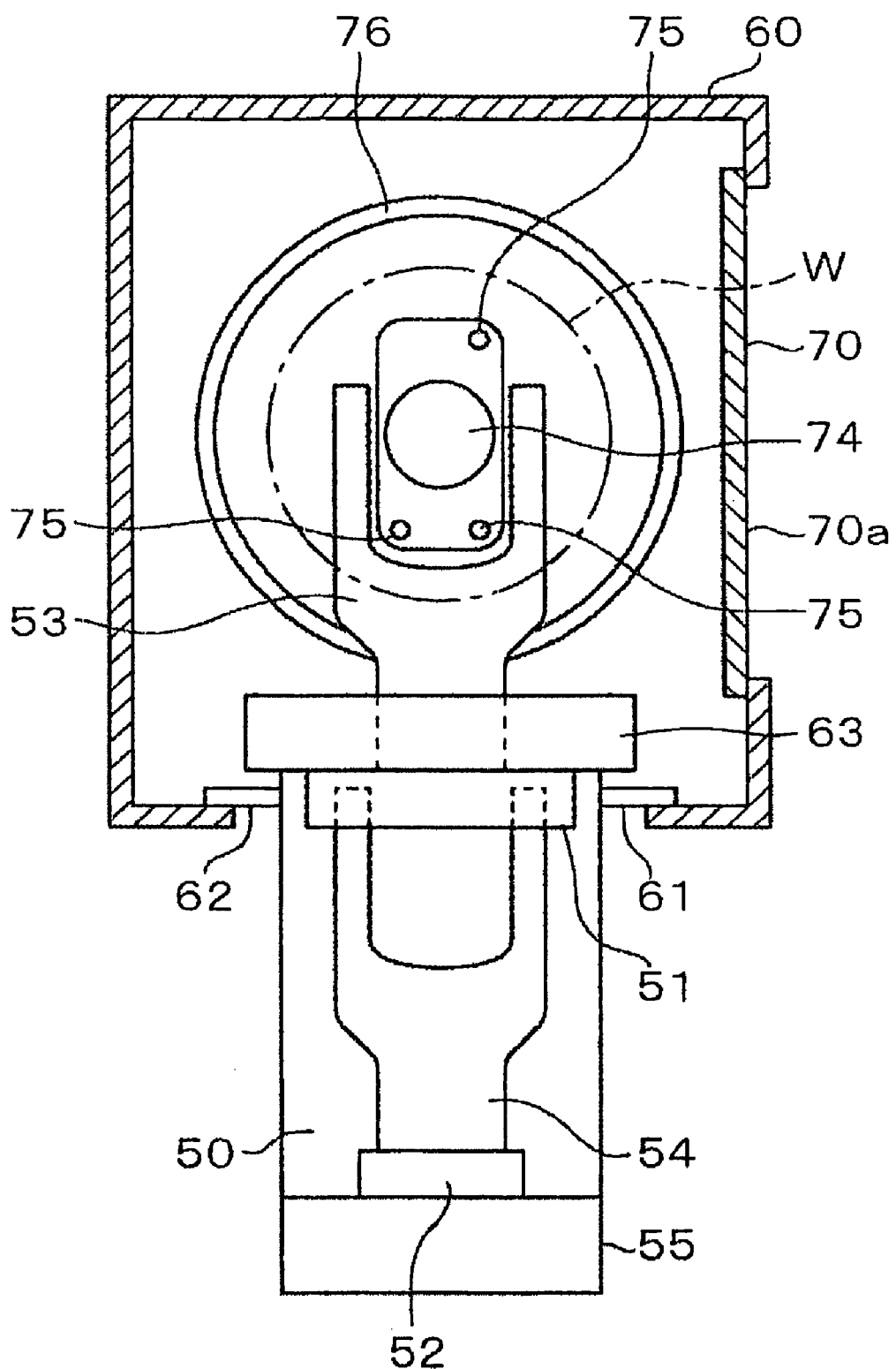
FIG. 6 is a plan view of the cleaning unit shown in FIG. 5.
Figure 7:
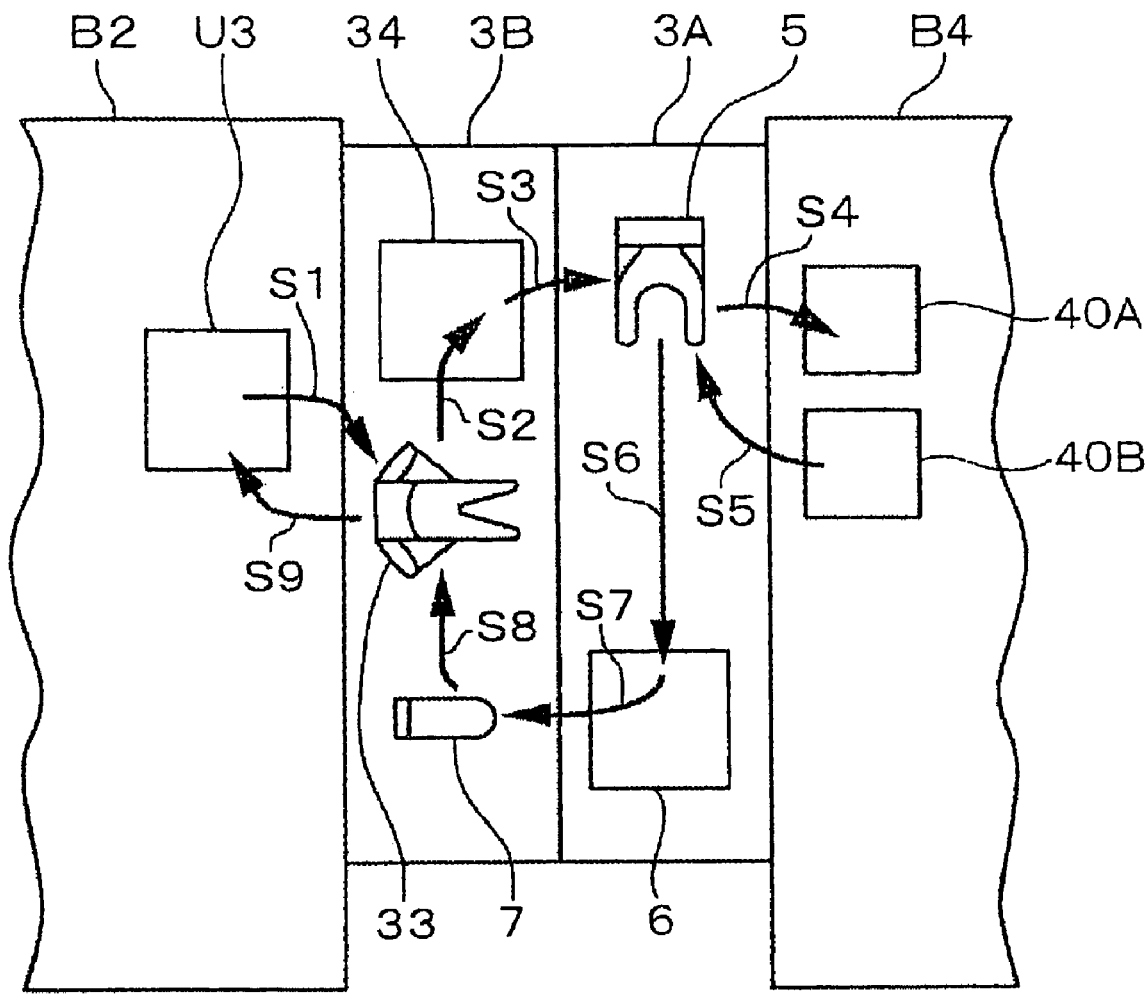
FIG. 7 is a typical plan view of assistance in explaining a wafer carrying passage in the interface block.

The cleaning unit 6 will be described with reference to FIGS. 5 and 6, which are a longitudinal sectional view and a cross-sectional plan view, respectively, showing the cleaning unit 6 and the arm member 53 of the carrying arm 5 inserted in the cleaning unit 6. The cleaning unit 6 has a casing 60 having a side wall provided with an opening 61 closed by a shutter 62. A wafer W held by the arm member 53 is carried through the opening 61 into the casing 60. The casing 60 has a side wall provided with an opening 70 through which a carrying arm 7 carries a wafer W into the casing 60. The opening 70 is closed by a shutter 70a.

An arm cleaning head (hereinafter, referred to simply as "cleaning head") 63 is suspended from the top wall of the casing 60 so as to face the passage of the arm member 53 in the casing 60. The cleaning head 63 extends perpendicularly to the passage of the arm member 53 and has a length corresponding to the width of the arm member 53. A cleaning liquid supply pipe 64 and a purging gas supply pipe 65 are connected to the top wall of the cleaning head 63. Cleaning liquid pouring ports and purging gas discharge ports are formed in the bottom wall of the cleaning head 63. The cleaning liquid pouring ports and the purging gas discharge ports are arranged in straight rows, respectively, extending along the length of the cleaning head 63. The cleaning liquid supply pipe 64 is connected to the cleaning liquid pouring ports by passages formed in the cleaning head 63. The purging gas supply pipe 65 is connected to the purging gas discharge ports by passages formed in the cleaning head 63. The cleaning liquid supply pipe 64 is provided with a valve 64a and is connected to a cleaning liquid source 64A containing a cleaning liquid, such as pure water. The purging gas supply pipe 65 is provided with a valve 65a and is connected to a purging gas source 65A containing an inert gas, such as nitrogen gas ($N_2$). A drain cup 66 is disposed below the cleaning head 63 to contain the used cleaning liquid. A drain pipe 67 serving also as a suction pipe is connected to a lower part of the drain cup 66.

A shower head 71, namely, a cleaning liquid pouring member, is suspended from the top wall of the casing 60 at a position on the inner side of the cleaning head 63. A cleaning liquid supply pipe 72 and a purging gas supply pipe 73 for supplying a drying gas are connected to the top wall of the shower head 71. Cleaning liquid pouring ports and purging gas discharge ports are formed in the bottom wall of the shower head 71. The cleaning liquid pouring ports and the purging gas discharge ports are arranged in separate rows, respectively, or are alternately arranged. The cleaning liquid supply pipe 72 is connected to the cleaning liquid pouring ports by passages formed in the shower head 71. The purging gas supply pipe 73 is connected to the purging gas discharge ports by passages formed in the cleaning head 71. The cleaning liquid supply ports may be used also as purging gas discharge ports. The cleaning liquid supply pipe 72 is provided with a valve 72a and is connected to the cleaning liquid supply pipe 64. The purging gas supply pipe 73 is provided with a valve 73a and is connected to the purging gas supply pipe 65. The valves 64a and 72a are operated to supply the cleaning liquid to either of the cleaning head 63 and the shower head 71. The valves 65a and 73a are operated to supply the purging gas to either of the cleaning head 63 and the shower head 71.

A wafer support table 74 for supporting a wafer W thereon in a horizontal position is disposed below a central part of the shower head 71. The wafer support table 74 is, for example, a vacuum chuck capable of attracting a central part of a wafer W by suction to hold the wafer W in a horizontal position. The wafer support table 74 is received in a central space in the arm member 53 to transfer a wafer W between the arm member 53 and the wafer support table 74. A driving mechanism 74b drives the wafer support table 74 for rotation about a vertical axis.

Three pins 75 held on a lifting member 75a is arranged around the wafer support table 74. A driving mechanism 75b moves the lifting member 75a vertically to move the pins 74 vertically. A wafer W can be transferred between the arm member 53 and the wafer support table 74 by vertically moving the pins 74. The wafer support table 74 is surrounded by a cup 76. A drainpipe 77 is connected to the bottom of the cup 76. The drain pipe 77 is connected to the drain pipe 67. The drain pipe 77 is connected to a valve 77a connected to a suction device 78.

Figure 3:
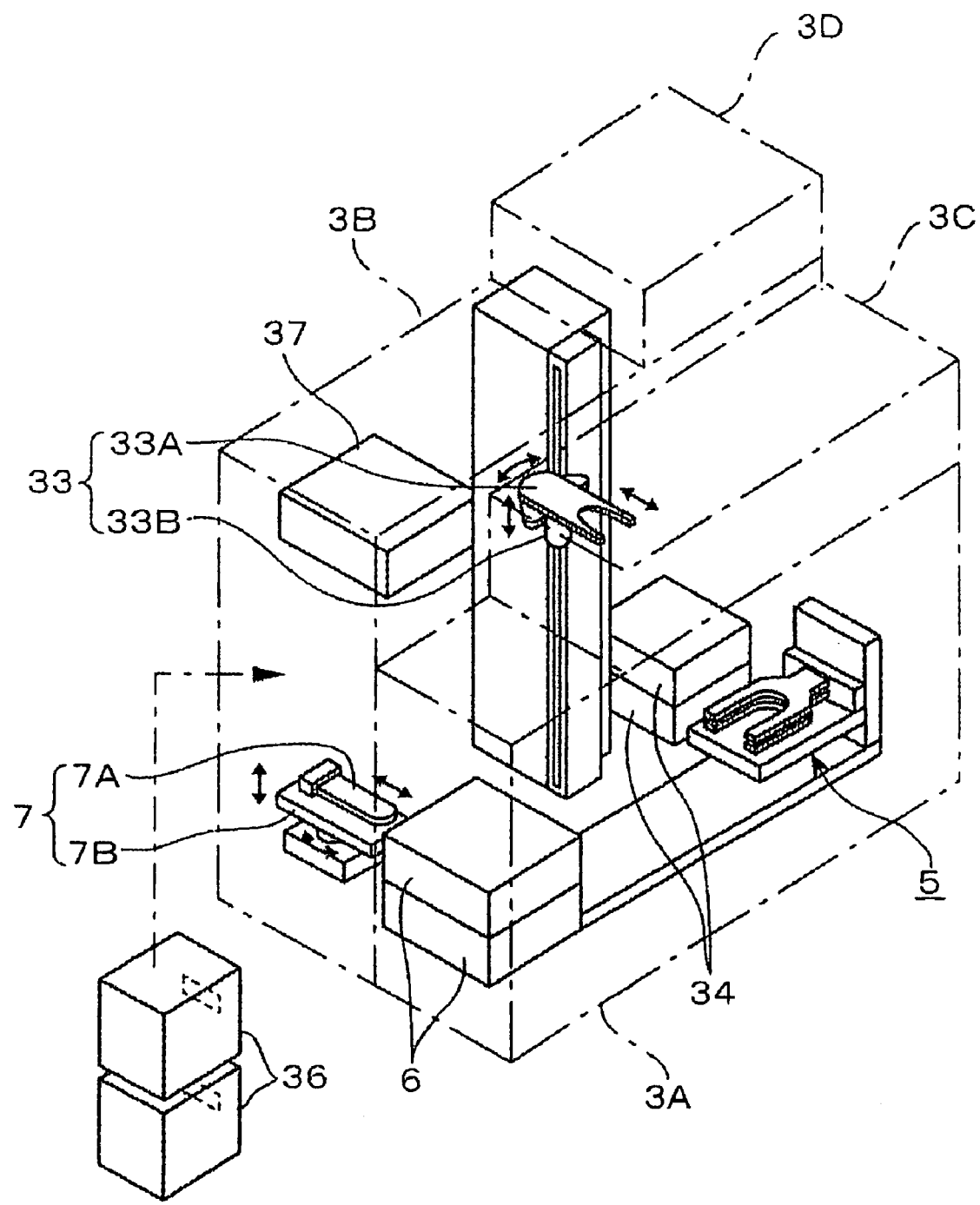
FIG. 3 is a perspective view of an interface block included in the coating and developing system shown in FIG. 1.

Referring attain to FIG. 3, the transfer chamber 3B, similarly to the transfer chamber 3A, is a closed space defined by a casing. An opening, not shown, is formed in a side panel of the casing, and the opening is closed by shutter. A wafer W is transferred between the transfer chambers 3A and 3B through the opening. Two precision temperature adjusting units 34 are stacked in a vertical arrangement in a left part, as viewed from the side of the carrier handling block B1, of the transfer chamber 3B. Each of the precision temperature adjusting units 34 is provided with a transfer stage serving also as a cooling plate.

A carrying arm 7 is disposed in a lower left part, as viewed from the side of the carrier handling block B1, of the transfer chamber 3B. The carrying arm 7 receives a wafer W from the cleaning unit 6. The carrying arm 7 has a base member 7B capable of turning about a vertical axis and an arm member 7A supported for linear movement on the base member 7B. The arm member 7A is able to advance through the opening into the cleaning unit 6 disposed in the transfer chamber 3A.

Two buffer cassettes 36 each capable of temporarily holding, for example, thirteen wafers W are disposed one on top of the other above the carrying arm 7. An edge exposure system 37 capable of selectively exposing only an edge part of a wafer W is disposed above the buffer cassettes 36. A carrying arm 33 is disposed in a central part of the transfer chamber 3B. The carrying arm 37 has an arm member 33A and a base member 33B supporting the arm member 33A thereon to move the arm member vertically and to turn the arm member 33A about a vertical axis. The carrying arm 33 carries a wafer W between the buffer cassette 36 and the edge exposure system 37. The carrying arm 33 and the carrying arm 7 correspond to the second carrying mechanism. The carrying arm 33 receives a wafer W from the processing block B2 and transfers the wafer through the precision temperature adjusting unit 34 to the carrying arm 5, namely, the first carrying mechanism. The carrying arm 33 receives a wafer W from the carrying arm 7 and transfers the wafer W to the processing block B2. The air current control unit 3D placed on the transfer chamber 3B supplies clean air of a fixed temperature downward into the transfer chamber 3B. The coating and developing system in the first embodiment is provided with a controller, not shown, such as a computer, having a program storage device. The program storage device stores pieces of software including programs, namely, sets of instructions specifying operations for processing a wafer and transferring a wafer for the controller to execute. The controller reads the programs from the program storage device and controls the operations of the coating and developing system according to the programs. The programs are recorded in a recording medium, such as a hard disk, a compact disk or a magnetooptical disk, and the recording medium is loaded into the program storage device.

The operations of the coating and developing system will be described. A carrier 2 holding wafers W is delivered from an external device to the carrier support table 20a. Then, the gate 21 is opened and the lid of the carrier 2 is removed. Then, the transfer device A1 takes out a wafer W from the carrier 2. Then, the wafer W is transferred through the transfer unit of the first shelf unit U1 to the main carrying device A2. The main carrying device A2 carries the wafer W to, for example, an antireflection film forming unit, namely, one of the units, for carrying out pretreatment processes before a coating process, of the liquid-processing unit U4. The antireflection film forming unit forms an antireflection film on a surface of the wafer W. The antireflection film prevents the reflection of exposure light in the exposure process. Then, the coating unit applies a resist to the wafer W to form a resist film on the wafer W. The wafer W coated with the resist film is subjected to a predetermined first heating process that heats the wafer at a temperature around, for example 100° C. by a heating unit, namely, one of the component units of the shelf units U1, U2 and U3. Subsequently, the wafer W is cooled at a predetermined temperature by a cooling unit. If the heating unit is provided with a cooling plate, the heated wafer W is heated by the cooling plate.

A carrying operation for carrying a wafer W in the interface block B3 will be described with reference to FIG. 3 and FIG. 4 typically showing the flow of a wafer W. The carrying arm 33 carries the cooled wafer W into the transfer chamber 3B (step S1). The wafer W is subjected to an edge exposure process in the edge exposure system 37. The carrying arm 33 carries the wafer W processed by the edge exposure process to the precision temperature adjusting unit 34 (step S2). The precision temperature adjusting unit 34 adjusts the temperature of the surface of the wafer W precisely to a set temperature corresponding to a temperature in the exposure system B4. After the wafer W has been cooled, the arm member 54 of the carrying arm 5 advances through the opening into the precision temperature adjusting unit 34 to hold the wafer W (step S3). Then, the carrying arm 5 carries the wafer W through the opening onto the receiving stage 40A of the exposure system B4 (step S4).

The wafer W processed by the immersion exposure process by the exposure system B4 is transferred from the delivery stage 40B through the opening to the carrying member 53 of the carrying arm 5 in the transfer chamber 3A (step S5). Then, the carrying arm 5 received the wafer W moves toward the cleaning unit 6 and the shutter 62 of the cleaning unit 6 is opened. As shown in FIGS. 5 and 6, the arm member 53 holding the wafer W advances into the cleaning unit 6 and transfers the wafer W to the pins 75, and then the pins 74 place the wafer W on the wafer support table 74 (step S6). While the wafer W is being carried from the exposure system B4 to the cleaning unit 6, the air conditioning unit 3C maintains the transfer chamber 3A, for example, at a temperature of 23° C. equal to the temperature of the interior of the exposure system B4 and at a relative humidity of 70% equal to the relative humidity of the interior of the exposure system B4.

The carrying arm 5 is withdrawn from the cleaning unit 6 and the shutter 62 is closed after the wafer W has been transferred to the cleaning unit 6. Then, the wafer support table 74 is rotated in a horizontal plane, pure water, namely, a cleaning liquid, is supplied from the cleaning liquid source 64A to the shower head 71 and pure water is discharged through the shower head 71 for a predetermined time to clean the surface of the wafer W. Nitrogen gas is supplied from the purging gas source 65A to the shower head 71 after stopping supplying the cleaning liquid to the shower head 71. Nitrogen gas is discharged through the shower head 71 toward the surface of the wafer W while the wafer support table 74 is kept rotating to dry the wafer W. While the wafer w is being cleaned and dried, water dripped from the wafer W and water scattered by the wafer is collected in the cup 76. The water collected in the cup 76 is sucked by the suction device to drain the water through the drain pipe 77 from the cleaning unit 6.

After the wafer W has been dried, the carrying arm 7 is moved toward the cleaning unit 6 and the shutter 70a of the cleaning unit 6 is opened. The arm member 7A of the carrying arm 7 is advances through the opening 70 into the cleaning unit 6, receives the wafer W from the pins 75 and withdraws from the cleaning unit 6. (Step S7). Subsequently, the wafer W is transferred from the carrying arm 7 to the carrying arm 33 (step S8). Then, the carrying arm 33 carries the wafer W to the second heating unit included in the shelf unit U3 of the processing block B2 (step S9). If a condition of an operation for carrying other wafer W in the exposure system B4 or the processing block B2 requires, the controller interrupts the progress of the foregoing steps while the foregoing steps are being sequentially executed, and makes the carrying arm 33 carry the wafer W to the buffer cassette 36 for temporary storage. The wafer W is taken out of the buffer cassette 36 later and the rest of the steps are executed.

A carrying operation for carrying the wafer W in the processing block B2 will be briefly described. The wafer W is processed by a predetermined heating process by the second heating unit, and then the wafer W is cooled at a predetermined temperature by the cooling unit. When the second heating unit is provided with a cooling plate capable of moving in horizontal directions, the wafer W is cooled by the cooling plate of the second heating unit. Then, the wafer W is carried to the developing unit (DEV) and is subjected to a predetermined developing process. The main carrying device A3 takes out the wafer W processed by the developing process from the developing unit. Then the wafer W is carried by the main carrying devices A2 and A3 to the heating unit and is subjected to a predetermined heating process. Then, the wafer W is cooled at a predetermined temperature by the cooling unit. Then, the wafer @ is returned through the transfer unit of the first shelf unit U1 to, for example, the carrier 2, from which the wafer W was taken out, placed in the carrier handling block B1.

After the foregoing wafer carrying operation has been repeated by a predetermined number of cycles, the carrying arm 5 not holding any wafer is moved toward the cleaning unit 6, the shutter 62 is opened, the first moving member 51 advances into the cleaning unit 6 and the suction device 78 evacuates the cup 66 to create a vacuum atmosphere in the cup 66. Then, pure water is supplied from the cleaning liquid source 64A through the cleaning liquid supply pipe 64 to the cleaning head 63. Pure water is discharged downward through the cleaning head 63 while the arm member 53 is continuously advanced into the cleaning unit 6 to clean the arm member 53.

The advancement of the arm member 53 is stopped, and then the discharge of pure water is stopped. Then, the purging gas, such as nitrogen gas or clean air, is supplied from the purging gas source 65A through the purging gas supply pipe 65 into the cleaning head 63, and the purging gas is discharged down ward. The purging gas is discharged through the cleaning head 63 while the arm member 53 is being gradually withdrawn to remove pure water remaining on the arm member 53 and to dry the arm member 53. The used cleaning liquid, namely, a waste liquid, is collected in the cup 66 and is drained from the cleaning unit 6 through the drain pipes 67 and 77 during the cleaning and drying operation. The cleaning liquid may be poured and the purging gas may be discharged either while the arm member 53 is being advanced or while the arm member 53 is being withdrawn. The arm member 53 may be reciprocated several times and the cleaning liquid may be poured and the purging gas may be discharged while the carrying arm 53 is being reciprocated.

In the coating and developing system embodying the present invention, the carrying arm 5, namely, the first carrying mechanism, carries the wafer W processed by immersion exposure to the cleaning unit 6, and then the cleaning unit 6 cleans the wafer W processed by immersion exposure. Therefore, even if particles produced on the surface of the wafer W by the eluates containing the resist remain on the wafer W, the wafer W can be cleared of the particles. Particles are likely to stick to the wafer W if the wafer W is wetted with a liquid. However, additional particles are restrained from sticking to the surface of the wafer W because the wafer W is dried. The carrying arm 5, namely, the first carrying mechanism, carries the wafer W to the cleaning unit 6, and the carrying arms 7 and 33, namely, the second carrying mechanism, carry the wafer W to the processing block B2. Therefore, the processing units of the processing block B2 and the wafer W processed by the processing units are prevented from being contaminated with particles. Thus adverse influences of particles on the line-width of a pattern due to irregular heating by the heating process attributable to particles, damaging the pattern with particles in the developing process can be prevented and, consequently, a minute resist pattern can be accurately formed on the wafer W. Since the contamination of the processing block B2 with particles can be reduced, the adhesion of particles to the wafer W while the wafer W is being carried to the exposure system B4 can be restrained and hence the accumulation of particles in the exposure system B4 can be restrained. Consequently, obstruction of exposure by the migration of particles in the liquid layer during immersion exposure can be prevented.

The carrying arm 5 uses the arm member 53 for receiving the wafer W from the exposure system B4 and uses the arm member 54 for carrying the wafer W to the exposure system B4. Since the arm member 54 of the carrying arm 5 does not carry the wafer W processed by immersion exposure, the carrying arm 5 can carry the wafer W from the processing block B2 to the exposure system B4 without permitting the adhesion of liquid drops and particles to the wafer W. Thus, the accumulation of particles in the developing system can be surely restrained.

Although it is possible that particles migrate from the wafer W to the arm member 53, accumulate on the arm member 53 and scatter in the interface block B3, the arm 53 can be prevented from becoming a source of contamination with particles because the arm member 53 is cleaned periodically to remove particles from the arm member 53. Since additional work for removing the arm member 53 from the moving member 51 and cleaning the removed arm member 53 and work for replacing the arm member 53 with another one are not necessary, the coating and developing system has improved maintainability.

The air conditioning unit 3C controls the humidity of the transfer chamber 3A by humidifying the transfer chamber 3A. Consequently, the formation of water marks on the wafer W due to the drying of the liquid applied to the wafer W for immersion exposure can be prevented while the wafer W transferred from the exposure system B4 to the transfer chamber 3A is carried to the cleaning unit 6. Thus a resist pattern can be accurately formed on the wafer W because the developing process will not be obstructed by water marks.

In the coating and developing system of the present invention, the holding member cleaning unit is incorporated into the cleaning unit 6 to reduce the space necessary for installing the interface block. The holding member cleaning unit and the cleaning unit 6 may be installed separately. The arm members 53 and 54 are held on one and the same base member 50 to form the single carrying arm 5 to reduce a necessary space. The first carrying mechanism may include two carrying arms respectively provided with the arm members 53 and 54.

Figure 8:
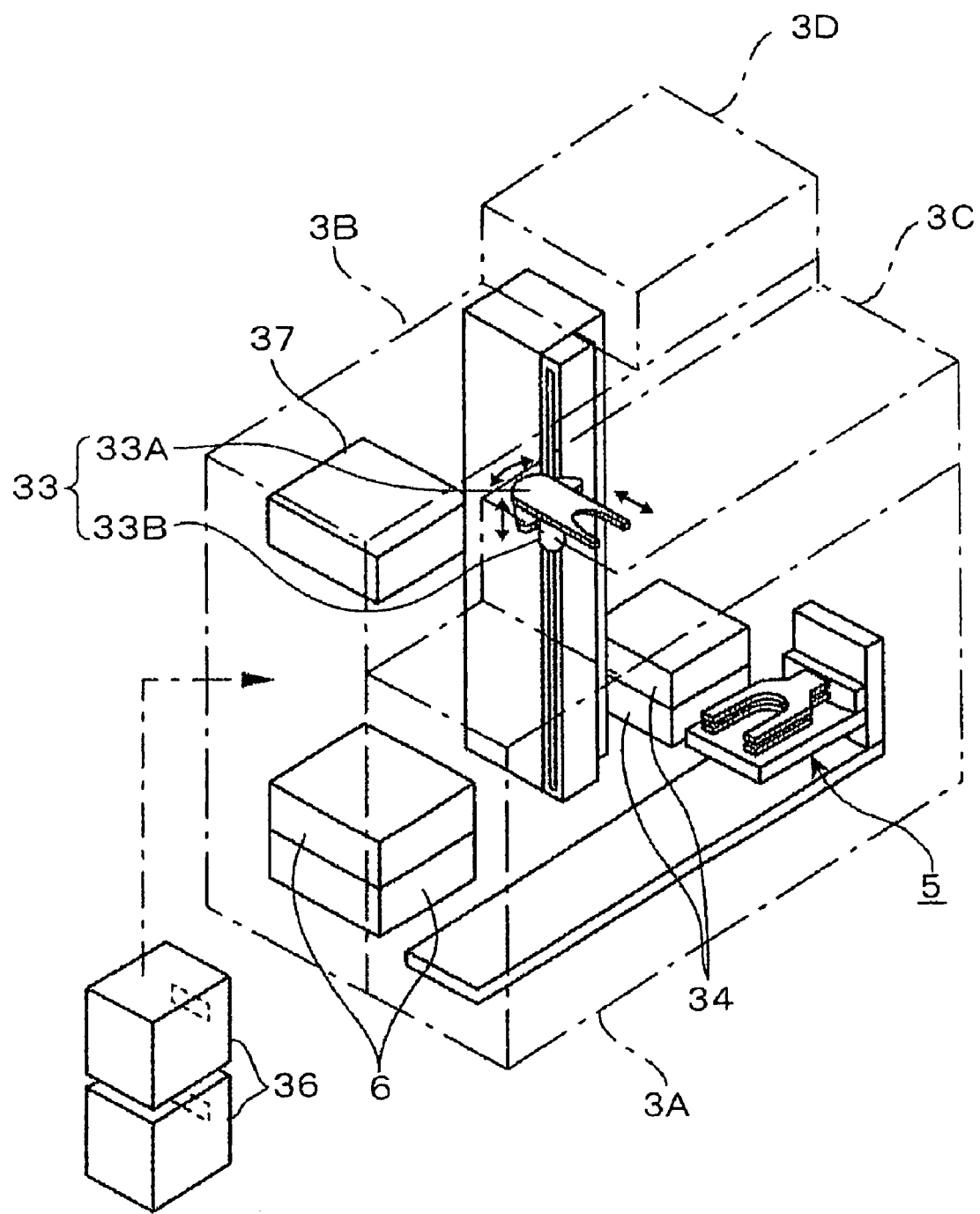
FIG. 8 is a perspective view of the interface block included in a coating and developing system in a second embodiment according to the present invention.

A coating and developing system in a second embodiment according to the present invention is provided with an interface block B3 shown in FIG. 8, which is different from the interface block B3 of the coating and developing system in the first embodiment. Referring to FIG. 8, the interface block B3 is not provided with any device corresponding to the carrying arm 7, and cleaning units 6 are disposed in a transfer chamber 3B. A carrying arm 33 is the second carrying mechanism. The carrying arm 33 operates both for carrying a wafer W cleaned by the cleaning unit 6 from the cleaning unit 6 to a processing block B2 and for receiving a wafer W from the processing block B2 and transferring the wafer W through a precision temperature adjusting unit 34 to a carrying arm 5. Effects of the coating and developing system in the second embodiment are the same as those of the coating and developing system in the first embodiment.

Figure 9:
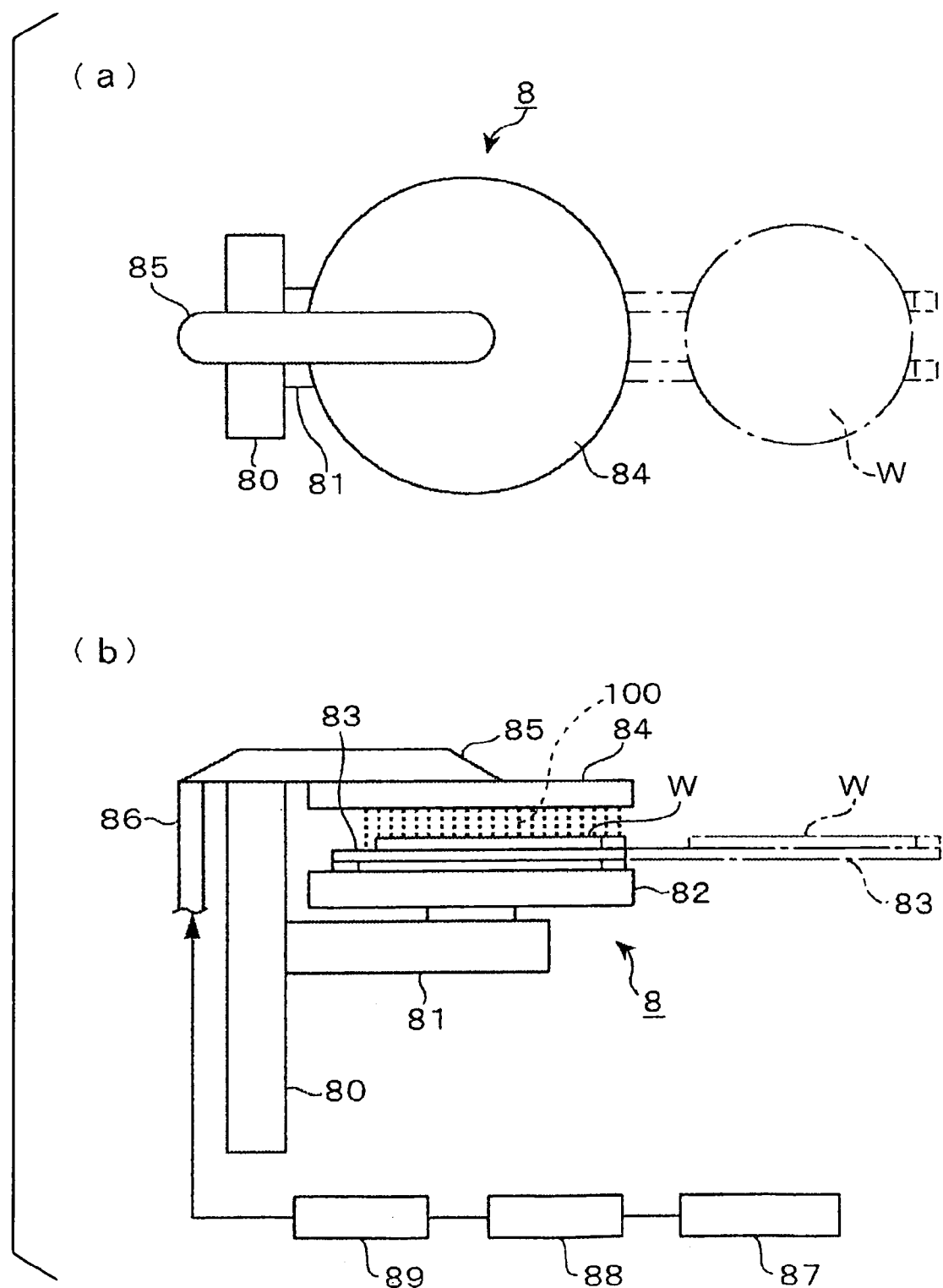
FIGS. 9(*a*) and 9(*b*) are a plan view and a side elevation, respectively, of a carrying mechanism and a humidifying unit in modifications.

In a coating and developing system in a third embodiment according to the present invention, an air conditioning unit may be combined with a first carrying mechanism. FIG. 9 shows a carrying arm, namely, the first carrying mechanism, included in the coating and developing system in the third embodiment. Referring to FIG. 9, a base 82 is supported for rotation about a vertical axis on a lifting member 81 that moves vertically along a vertical guide rail 80. An arm member 83 is movable in opposite directions as indicated by chain lines on the base 82. The arm member 83 receives and holds a wafer W processed by immersion exposure. A shower head 84, namely, a humid air blowing device, of a size large enough to cover a surface of a wafer W is disposed above the base 82. The shower head 84 is held by a holding member 85 attached to the upper end of the guide rail 80. Indicated at 86 is a gas supply pipe. The gas supply pipe 86 is connected to passages formed in the shower head 84 and the holding member 85. A plurality of small discharge holes formed in the lower wall of the shower head 84 communicate with the passage formed in the shower head 84. An air source 87, a temperature control device 88 and a humidifying device 89 are connected to the gas supply pipe 86. A gas supplied from the air source 87 is supplied through the gas supply pipe 86 and is discharged downward through the discharge holes of the shower head 84. The temperature control device 88 and the humidifying device 89 adjust the temperature and the moisture content of the gas to a set temperature and a set moisture content, respectively.

When a wafer W processed by the exposure system B4 is delivered to the transfer chamber 3A, the arm member 83 is advanced to receive the wafer W and a gas discharge operation is started to discharge a humidified gas 100 through the discharge holes of the shower head 84. Then, the carrying arm 83 is returned to its home position indicated by continuous lines in FIG. 9. The carrying arm 8, similarly to the carrying arm 5, moves toward the cleaning unit 6 to carry the wafer W into the cleaning unit 6 while the humidified gas 100 is discharged continuously. Thus, the humidity of an atmosphere around the exposed wafer W is controlled to prevent water applied to the wafer W for immersion exposure from drying. Consequently, the formation of water marks on the wafer W can be prevented and the exposure process is prevented from being obstructed by water marks. Although the first carrying mechanism shown in FIG. 9 is provided with the single arm member 83, the first carrying mechanism may be provided with two arm members and the two arm members may be used for carrying a wafer before exposure and for carrying a wafer after exposure, respectively.

Substrates to be processed by the coating and developing system of the present invention are not limited to wafers and may be, for example, glass substrates for liquid crystal displays.

What is claimed is:

1. A coating and developing system comprising:
a processing block including coating units for forming a resist film on a surface of a substrate and developing units for processing the substrate with a developer after the substrate has been processed by an exposure process;
an interface block connected to the processing block and an exposure system for carrying out an immersion exposure process in which a liquid layer is formed on the substrate;
wherein the interface block includes:
substrate cleaning units for cleaning the substrate processed by the immersion exposure process,
a first carrying mechanism provided with a holding member for carrying the substrate from the exposure system to the substrate cleaning unit, and
a second carrying mechanism for carrying the substrate from the substrate cleaning unit to the processing block.

2. The coating and developing system according to claim 1, wherein the second carrying mechanism transfers a substrate from the processing block to the first carrying mechanism and the first carrying mechanism transfers the substrate to the exposure system.

3. The coating and developing system according to claim 2, wherein the first carrying mechanism is provided with a first holding member specially for carrying a substrate from the exposure system to the substrate cleaning unit and a second holding member specially for carrying a substrate to the exposure system.

4. The coating and developing system according to claim 2, wherein the second carrying mechanism is provided with a carrying arm for carrying a substrate out of the substrate cleaning unit and a transfer arm for receiving a substrate from the carrying arm and transferring the same to the processing block.

5. The coating and developing system according to claim 2, wherein the interface block is provided with a holding member cleaning unit for cleaning the holding member, of the first carrying mechanism, for carrying a substrate to the substrate cleaning unit.

6. The coating and developing system according to claim 2 further comprising a humidifying unit for humidifying an atmosphere around a substrate being carried to the substrate cleaning unit to restrain the drying of the substrate processed by immersion exposure.

7. The coating and developing system according to claim 2, wherein the first carrying mechanism includes a first carrying arm specially for taking a substrate out of the substrate cleaning unit and a second arm member specially for carrying a substrate to the exposure system.

8. The coating and developing system according to claim 1, wherein the second carrying mechanism includes a first carrying arm for taking out a substrate from the substrate cleaning unit and a second carrying arm for receiving a substrate from the first carrying arm and transferring the substrate to the processing block.

9. The coating and developing system according to claim 1, wherein a holding member cleaning unit for cleaning a holding member, for carrying a substrate to the substrate cleaning unit, of the first carrying mechanism is placed in the interface block.

10. The coating and developing system according to claim 9, wherein the holding member cleaning unit is combined with the substrate cleaning unit.

11. The coating and developing system according to claim 10, wherein the holding member cleaning unit is disposed opposite to a path along which the carrying arm advances into the substrate cleaning unit.

12. The coating and developing system according to claim 1 further comprising a humidifying unit for humidifying an atmosphere around a substrate being carried to the substrate cleaning unit to restrain the drying of the substrate processed by immersion exposure.

13. The coating and developing system according to claim 12, wherein the humidifying unit is combined with the first carrying mechanism.

14. A coating and developing method of coating a surface of a substrate with a resist film, processing the resist film by immersion exposure using a liquid layer formed on the resist film formed on the substrate, carrying the substrate to a processing block and developing the exposed resist film by a developer, said coating and developing method comprising the steps of:

carrying the substrate processed by immersion exposure to a substrate cleaning unit by a first carrying mechanism;

cleaning the substrate by a substrate cleaning unit; and carrying the substrate cleaned by the substrate cleaning unit to the processing block by a second carrying mechanism.

15. The coating and developing method according to claim 14, wherein the step of carrying the substrate to the substrate cleaning unit carries the substrate by a first special holding member included in the first carrying mechanism, and includes the step of carrying the substrate from the exposure system to the substrate cleaning unit by a second special holding member included in the first carrying mechanism.

16. The coating and developing method according to claim 15 further comprising the step of cleaning the first special holding member, for carrying the substrate to the substrate cleaning unit, included in the first carrying mechanism by a holding member cleaning unit.

17. The coating and developing method according to claim 15 further comprising the step of humidifying an atmosphere around a substrate in a period in which the substrate transferred from the exposure system to the interface block is carried to the substrate cleaning unit.

18. The coating and developing method according to claim 14 further comprising the step of cleaning a holding member, for carrying a substrate to the substrate cleaning unit, included in the first carrying mechanism by a holding member cleaning unit.

19. The coating and developing method according to claim 18, wherein the holding member cleaning unit is disposed opposite to a path along which a carrying arm advances into the substrate cleaning unit.

20. The coating and developing method according to claim 14, further comprising the step of humidifying an atmosphere around a substrate in a period in which the substrate transferred from the exposure system to the interface block is carried to the substrate cleaning unit.

21. The coating and developing method according to claim 20, the step of humidifying the atmosphere around the substrate is carried out by a humidifying unit included in the first carrying mechanism.

* * * * *